United States Patent
Liao et al.

(10) Patent No.: US 9,041,892 B2
(45) Date of Patent: May 26, 2015

(54) TAPE SUBSTRATE FOR CHIP ON FILM STRUCTURE OF LIQUID CRYSTAL PANEL

(75) Inventors: Liangchan Liao, Shenzhen (CN); Poshen Lin, Shenzhen (CN); Yu Wu, Shenzhen (CN)

(73) Assignee: SHENZHEN CHINA STAR OPTOELECTRONICS TECHNOLOGY CO., LTD., GUANGDONG (CN)

( * ) Notice: Subject to any disclaimer, the term of this patent is extended or adjusted under 35 U.S.C. 154(b) by 591 days.

(21) Appl. No.: 13/375,479

(22) PCT Filed: Aug. 26, 2011

(86) PCT No.: PCT/CN2011/078959
§ 371 (c)(1),
(2), (4) Date: Nov. 30, 2011

(87) PCT Pub. No.: WO2013/020306
PCT Pub. Date: Feb. 14, 2013

(65) Prior Publication Data
US 2013/0033669 A1 Feb. 7, 2013

(30) Foreign Application Priority Data
Aug. 5, 2011 (CN) .......................... 2011 1 0224341

(51) Int. Cl.
G02F 1/1345 (2006.01)
H05K 1/00 (2006.01)
H01L 23/498 (2006.01)
H01L 23/00 (2006.01)
(Continued)

(52) U.S. Cl.
CPC ......... *G02F 1/13452* (2013.01); *H01L 23/4985* (2013.01); *H01L 24/13* (2013.01); *H01L 24/16* (2013.01); *H01L 24/81* (2013.01); *H01L 24/97* (2013.01); *H01L 2224/13144* (2013.01); *H01L 2224/16227* (2013.01); *H01L 2224/81203* (2013.01); *H01L 2224/97* (2013.01); *H01L 2924/15162* (2013.01); *H05K 2201/09227* (2013.01); *H05K 2201/10681* (2013.01); *H01L 2224/16225* (2013.01); *H01L 23/49838* (2013.01)

(58) Field of Classification Search
CPC ..... G02F 1/13452; G02F 1/1345; H05K 7/06; H01L 23/49838; H01L 24/97
USPC ........... 349/149, 150, 152; 361/749; 174/255, 174/260; 257/668, 737
See application file for complete search history.

(56) References Cited

U.S. PATENT DOCUMENTS

| | | | |
|---|---|---|---|
| 6,911,729 B1 * | 6/2005 | Chikawa | 257/724 |
| 2006/0220242 A1 * | 10/2006 | Kawamura | 257/737 |
| 2008/0079889 A1 * | 4/2008 | Lee et al. | 349/151 |
| 2010/0245299 A1 * | 9/2010 | Han et al. | 345/204 |

* cited by examiner

Primary Examiner — Dung Nguyen
Assistant Examiner — Tai Duong

(57) ABSTRACT

The present invention discloses a tape substrate for chip on film structure of a liquid crystal panel. The tape substrate is provided with plural package units of chip on film structures arranged along its longitudinal direction, and the package unit has a driver chip, input leads and output leads. The longitudinal direction of the driver chip is parallel to the longitudinal direction of the tape substrate, and the input leads and the output leads are located at the two opposite sides of the driver chip. Each package unit is set up with a short side and a long side, and the input leads are formed at the short side, while the output leads are formed at the long side. In the package units adjacent to each other, the short side of one package unit joins the long side of a next package unit. This invention further discloses a liquid crystal panel having the tape substrate.

6 Claims, 4 Drawing Sheets

TAPE SUBSTRATE FOR CHIP ON FILM STRUCTURE OF LIQUID CRYSTAL PANEL

BACKGROUND OF THE INVENTION

1. Field of the Invention

The present invention relates to a field of liquid crystal display techniques. More particularly, the present invention relates to a tape substrate for chip on film structure of a liquid crystal panel, and further relates to a liquid crystal panel.

2. Description of the Prior Art

With the advancement of liquid crystal display techniques, the demand for the quality of various parts in the liquid crystal panel is getting higher.

The traditional technique for chip on film (COF) type of package structures basically adopts the technique of tape automated bonding (TAP) for thermal pressing and packaging of driver chips, and the chips on films are put in roll for packing and delivery. During the use, each COF structure is cut from the tape substrate sequentially, and is electrically connected between transparent circuits on a glass substrate of the liquid crystal panel and a driver circuit board. The glass substrate and the driver circuit board are provided with at least one COF structures therebetween. The broader the size of liquid crystal panel is, the more the number of COF structures will be in use.

Referred to FIG. 1, within the COF structure, the lengthwise direction D2 of the driver chip 11 is perpendicular to the longitudinal direction D1 of the tape substrate 10, and input leads 12 of the tape substrate 10 close to the printed circuit board (PCB) side and input leads 13 close to outer lead bonding (OLB) side of the glass substrate are located in the two opposite sides of the driver chip 11, wherein the input leads 12 and the input leads 13 are arranged in radiating shape mainly along the longitudinal direction D1 of the tape substrate 10.

To exemplify the output leads 13, the output leads 13 are connected to the transparent circuits (not shown in the drawings) on the glass substrate of the liquid crystal panel, the output leads 13 are not only more in wiring number, but also arranged denser in layout. As regards the traditional techniques of the COF, the width of the tape substrate 10 is smaller, about 35 or 48 mm in general, and its specification has been standardized, wherein the width of each COF on the tape substrate 10 cannot be enlarged at will. Moreover, as the size of the liquid crystal panel augments gradually, more pieces of COF are demanded, and each COF has more printed wires, and thus the traditional techniques of COF apparently cannot meet the requirements of denser in lead layout demanded by large-size liquid crystal panels.

Opposite to the output leads 13, the input leads 12 have less in wiring number, and in general has more unused space that are usually removed by etching and punching, to become voids between leads. Apparently, the limited width of COF fails to realize the most space utilization at the side of the input leads 12, which results in huge waste in material cost of the tape substrate 10.

Accordingly, how to settle the issues of the unbalanced wiring density between the input leads 12 side and the output leads 13 side existed in the traditional techniques of COF, the unused space of the tape substrate 10 that are not well utilized, and especially the voids between the input leads 12 that result in the material cost waste for the tape substrate 10, are one of the technical problems of the liquid crystal display that need to be settled.

SUMMARY OF THE INVENTION

An objective of the present invention is to provide a tape substrate for chip package of a liquid crystal panel, to settle the technical problems of the unbalanced wiring density of COF at the input leads side and output leads side for the traditional techniques, the unused space of the tape substrate that are not well utilized, and the voids between the input leads which result in the technical problem of waste of material cost of the tape substrate.

To settle the aforementioned problems, the present invention provides a tape substrate for chip on film structure of a liquid crystal panel, wherein the tape substrate is provided with plural package units of chip on film structures arranged along its longitudinal direction, and the package unit is provided with input leads and output leads. Each package unit is set up with a short side and a long side, and the short side and the long side are located at the two opposite sides of the tape substrate, wherein the input leads are formed at the short side while the output leads are formed at the long side. In the package units adjacent to each other, the short side of one package unit will join the long side of a next package unit. Each package unit is an isosceles trapezoid, and the input leads and the output leads of each package unit have the same wiring density.

An objective of the present invention is to provide a tape substrate for chip on film structure of a liquid crystal panel, to settle the unbalanced wiring density between the input leads side and the output leads side existed in the traditional techniques of COF, the unused space of the tape substrate of COF that are not well utilized, and especially the voids between the input leads which result in the technical problem of waste of material cost of the tape substrate.

To settle the aforementioned problems, the present invention provides a tape substrate for chip on film structure of a liquid crystal panel, wherein the tape substrate is provided with plural package units for chip on film structures arranged along its longitudinal direction, and the package unit is provided with input leads and output leads. Each package unit is set up with a short side and a long side, and the short side and the long side are located at the two opposite sides of the tape substrate, wherein the input leads are formed at the short side while the output leads are formed at the long side. In the package units adjacent to each other, the short side of one package unit will join the long side of a next package unit.

As regards a tape substrate for chip on film structure of a liquid crystal panel of this invention, each package unit is an isosceles trapezoid, to realize the preferred alternate arrangement.

As regards a tape substrate for chip on film structure of a liquid crystal panel of this invention, the input leads and the output leads of each package unit have the same wiring density, to achieve the preferred space utilization.

An objective of the present invention is to provide a tape substrate for chip on film structure in a liquid crystal panel, to settle the unbalanced wiring density between the input leads side and the output leads side existed in the traditional techniques of COF, the unused space of the tape substrate of COF that are not well utilized, and especially the voids between the input leads that result in the technical problem of waste of material cost of the tape substrate.

To settle the aforementioned problems, the present invention provides a tape substrate for chip on film structure of a liquid crystal panel, wherein the tape substrate is provided with plural package units for chip on film structures arranged along its longitudinal direction, and the package unit is provided with driver chip, input leads and output leads. The longitudinal direction of the driver chip is parallel to the longitudinal direction of the tape substrate. Each package unit is set up with a short side and a long side, and the short side and the long side are located at the two opposite sides of the tape substrate, wherein the input leads are formed at the short side while the output leads are formed at the long side. In the package units adjacent to each other, the short side of one package unit will join the long side of a next package unit.

As regards a tape substrate for chip on film structure in a liquid crystal panel of this invention, each package unit is an isosceles trapezoid.

As regards a tape substrate for chip on film structure in a liquid crystal panel of this invention, the input leads and the output leads of each package unit have the same wiring density.

An objective of the present invention is to provide a liquid crystal panel, to settle the unbalanced wiring density between the input leads side and the output leads side existed in the traditional techniques of COF, the unused space of the tape substrate of COF that are not well utilized, and especially the voids between the input leads, that result in the material cost waste for the tape substrate.

To settle the aforementioned problems, the present invention provides a liquid crystal panel, comprising a first substrate and a second substrate, wherein a transparent circuit on the second substrate passes through plural package units for chip on film structures to electrically connect to a driver circuit board. Each of the package units comprises a driver chip, input leads and output leads. Each package unit is set up with a short side and a long side. The input leads are formed at the short side while the output leads are formed at the long side. The input leads are electrically connected to the driver circuit board, and the output leads are electrically connected to the transparent circuit on the second substrate.

In a liquid crystal panel of this invention, each package unit is an isosceles trapezoid, to realize the preferred alternate arrangement.

In a liquid crystal panel of this invention, the input leads and the output leads of each package unit have the same wiring density, to achieve the preferred space utilization.

Relative to traditional techniques, the present invention has settled the unbalanced wiring density of COF at the input leads side and output leads side for the traditional techniques, the unused space of the tape substrate of COF that are not well utilized, and especially the voids between the input leads, which are the technical problems that results in waste of material cost of the tape substrate. The present invention has boosted the space utilization of the tape substrate of COF, and has reduced the material cost of the tape substrate.

This invention is detailed described with reference to the following preferred embodiments and the accompanying drawings.

DETAILED DESCRIPTION OF THE INVENTION

The following embodiments are described with reference to the following accompanying drawings which exemplify the realization of this invention.

Figure 1:
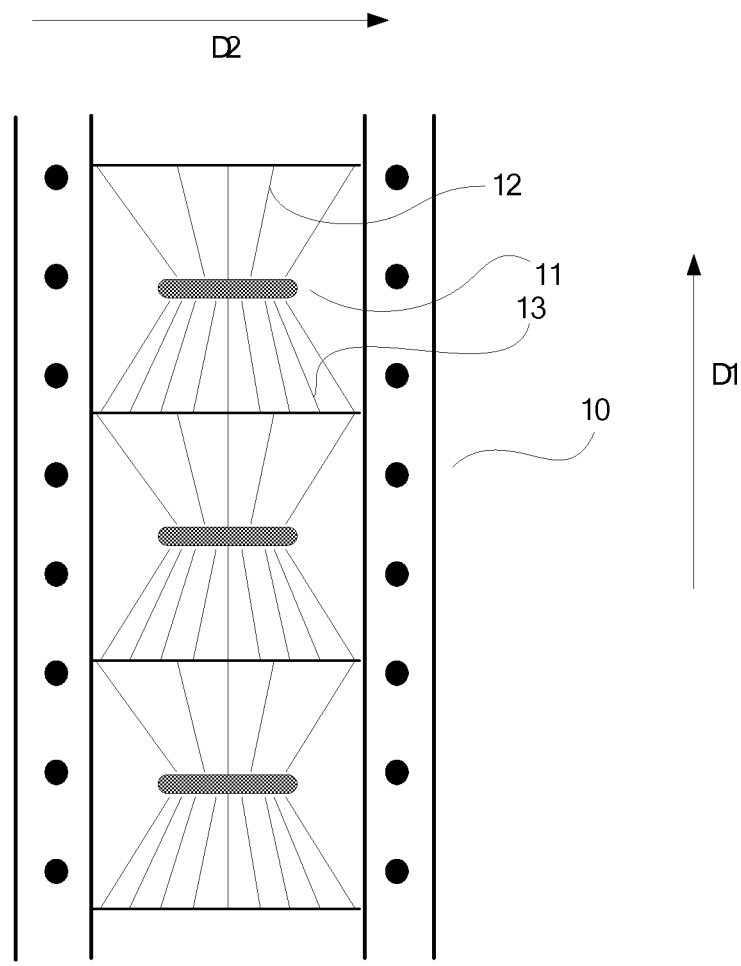
FIG. 1 is a schematic diagram of the package structure of a circuit board on a film of the traditional techniques.
Figure 2:
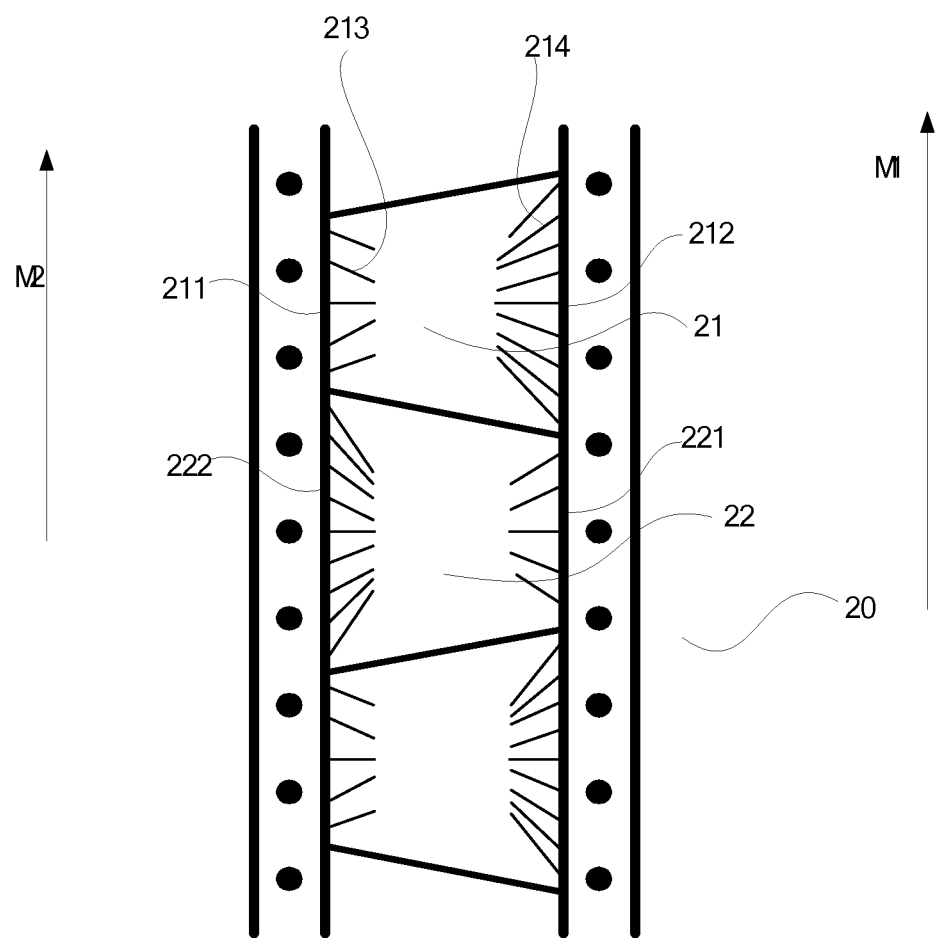
FIG. 2 is a schematic diagram of the structure of the first embodiment of a tape substrate for chip on film structure in a liquid crystal panel of this invention.

Referring to FIG. 2, FIG. 2 is a schematic diagram of the structure of the first embodiment of a tape substrate for chip on film structure in a liquid crystal panel of this invention.

The tape substrate comprises a tape substrate body 20, and further comprises plural package units 21, 22 and the like for chips on films that are arranged along the lengthwise/longitudinal direction M1 of the tape substrate body 20. Before the cutting, the package units are set up on the tape substrate body 20. The tape substrate body 20 usually is a flexible circuit board, comprising at least two layers of flexible polymer and one layer of leads/traces (not shown in the figure), wherein the layer of leads is located in between the two or more layers of flexible polymer.

Referring to FIG. 2, to exemplify the package unit 21, each package unit 21 is set up with a short side 211 and a long side 212, and the short side 211 and the long side 212 are located at the two opposite sides of the tape substrate body 20. The package unit 21 further comprises input leads 213 and output leads 214, wherein the input leads 213 are formed at the short side 211 while the output leads 214 are formed at the long side 212. The input leads 213 and the output leads 214 are part of the layer of leads of the tape substrate body 20.

Referring to FIG. 2, in a next package unit 22 adjacent to the package unit 21, the shorter side is defined as the short side 221 while the longer side is defined as the long side 222. In this embodiment, the short side 211 of the package unit 21 will join the long side 222 of the next package unit 22, while the long side 212 of the package unit 21 will join the short side 221 of the next package unit 22, and the link/join for any other adjacent package units is the same, which will not iterate herein.

Referring to FIG. 2, in the embodiment in FIG. 2, each package unit is an isosceles trapezoid. To exemplify the package unit 21, it is an isosceles trapezoid with the short side 211 as the top base and the long side 212 as the bottom base.

In the embodiment in FIG. 2, the input leads 213 of the package unit 21 preferably have the same wiring density as that of the output leads 214.

In the embodiment in FIG. 2, by the setup of the long side and the short side of each package unit, the output leads with more pins are formed at the long side while the input leads with fewer pins are formed at short side. The adjacent package units are linked in a short side to long side complementary arrangement in a cyclical manner, which makes full use of the spare space on the tape substrate body, especially the spare space at the input leads, substantially economize the material of the tape substrate.

Figure 3:
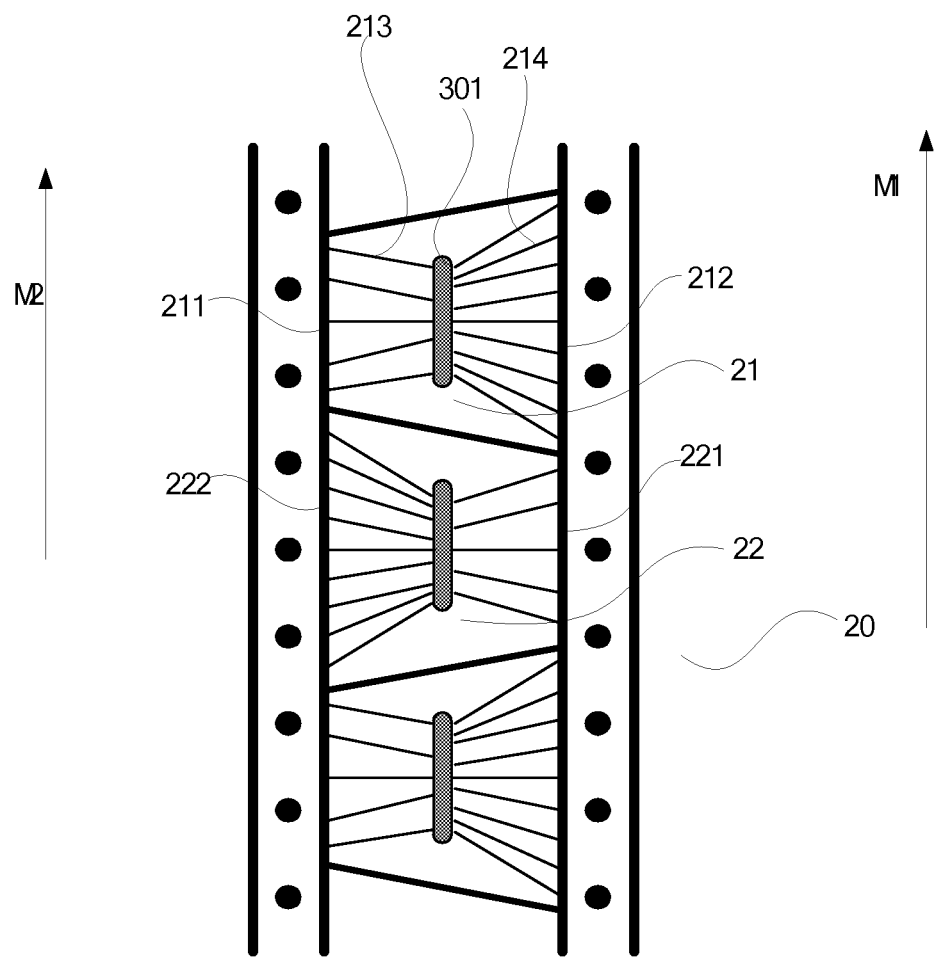
FIG. 3 is a schematic diagram of the structure of the second embodiment of a tape substrate for chip on film structure in a liquid crystal panel of this invention.

Referring to FIG. 3, FIG. 3 is a schematic diagram of the structure of the second embodiment of a tape substrate for chip on film structure in a liquid crystal panel of this invention.

The tape substrate comprises a tape substrate body 20, and further comprises plural package units 21, 22 and the like for chips on films that are arranged along the lengthwise/longitudinal direction M1 of the tape substrate body 20. Before the cutting, the package units are set up on the tape substrate body 20. The tape substrate body 20 usually is a flexible circuit board, comprising at least two layers of flexible polymer and one layer of leads (not shown in the figure), wherein the layer of leads is located in between the two or more layers of flexible polymer.

Referring to FIG. 3, to exemplify the package unit 21, each package unit 21 is set up with a short side 211 and a long side 212, and the short side 211 and the long side 212 are located at the two opposite sides of the tape substrate body 20. The package unit 21 further comprises input leads 213 and output leads 214, wherein the input leads 213 are formed at the short side 211 while the output leads 214 are formed at the long side 212. The input leads 213 and the output leads 214 are part of the layer of leads/traces of the tape substrate body 20.

Referring to FIG. 3, the difference between the embodiment in FIG. 3 and that in FIG. 2 is that the package unit 21 of the embodiment of FIG. 3 further comprises a driver chip 301, wherein the driver chip 301 has an active surface facing downward, with its gold bumps (not shown in the figure) bonding to the inner portion of the input leads 213 and output leads 214 by the thermal pressing.

In the embodiment in FIG. 3, the tape substrate body 20 extends along its longitudinal direction M1, and the driver chip 301 extends along its lengthwise direction M2 which is parallel to the M1.

Referring to FIG. 3, in a next package unit 22 adjacent to the package unit 21, the shorter side is defined as the short side 221 while the longer side is defined as the long side 222. In this embodiment, the short side 211 of the package unit 21 will join the long side 222 of a next package unit 22 while the long side 212 of the package unit 21 will join the short side 221 of the next package unit 22, and the link/join for any other adjacent package is the same, which will not iterate herein.

Referring to FIG. 3, in the embodiment in FIG. 3, each package unit is an isosceles trapezoid. To exemplify the package unit 21, it is an isosceles trapezoid with the short side 211 as the top base and the long side 212 as the bottom base.

In the embodiment in FIG. 3, the input leads 213 of the package unit 21 are selected preferably the same wiring density as that of the output leads 214.

In the embodiment in FIG. 3, through the setup of the long side and the short side of each package unit, the output leads with more pins are formed at the long side while the input leads with fewer pins are formed at short side. The adjacent package units are linked in a short side to long side complementary arrangement in a cyclical manner, which makes full use of the spare space on the tape substrate body, especially the spare space at the input leads, substantially economize the material of the COF tape substrate.

Figure 4:
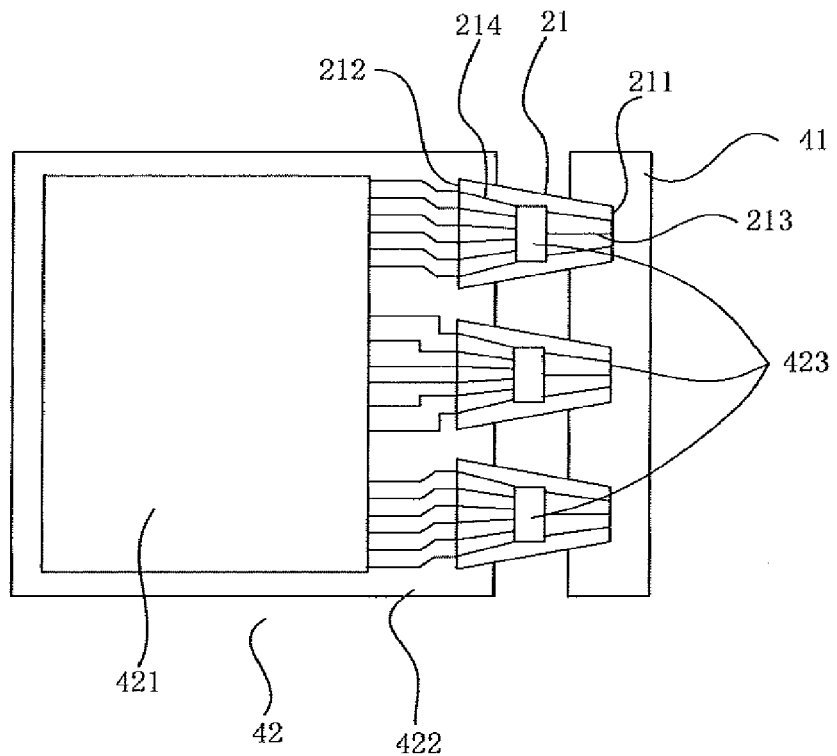
FIG. 4 is a top view of the assembly for a preferred embodiment of a liquid crystal panel, chip on film structure and a driver circuit board of this invention.
Figure 5:
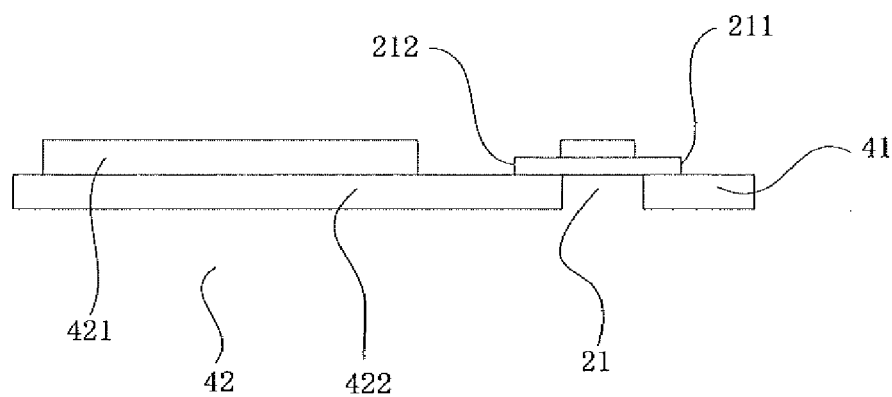
FIG. 5 is a side view of the assembly for a preferred embodiment of a liquid crystal panel, chip on film structure and a driver circuit board of this invention.

Referring to FIGS. 4 and 5, FIG. 4 is a top view of the assembly for a preferred embodiment of a liquid crystal panel, chip on film structure and a driver circuit board of this invention; and FIG. 5 is a side view of the assembly for a preferred embodiment of a liquid crystal panel, chip on film structure and a driver circuit board of this invention.

In the assembly structure of the FIGS. 4 and 5, comprising driver circuit board 41 and liquid crystal panel 42, wherein the liquid crystal panel 42 comprising a first substrate 421 and a second substrate 422, wherein a transparent circuit 423 on the second substrate 422 is electrically connected to a driver circuit board 41 by plural package units of chip on film structures, wherein the package units in FIGS. 4 and 5 are formed from the cutting of the tape substrate for COF structure in the liquid crystal panel in FIG. 3.

To exemplify the package unit 21, the package unit 21 connects to the driver circuit board 41 through the short side 211, and connects to the second substrate 422 of the liquid crystal panel 42 through the long side 212.

Referring to FIG. 3, the package unit 21 comprises a driver chip 301, input leads 213 and output leads 214. The package unit 21 is set up with a short side 211 and a long side 212. The input leads 213 are formed at the short side 211 while the output leads 214 are formed at the long side 212. The input leads 213 are electrically connected to the driver circuit board 41, and the output leads 214 are electrically connected to the transparent circuit 423 on the second substrate 422. The input leads 213 of the package unit 21 have preferably the same wiring density as that of the output leads 214.

In the embodiments, the package unit 21 is preferable selected as an isosceles trapezoid.

In general, although a few embodiments of the present invention have been disclosed, the above preferred embodiments are not used for limiting this invention, and it will be understood by those of ordinary skill in the art that various changes in form and details may be made therein without departing from the spirit and scope of the present invention.

What is claimed is:

1. A tape substrate for chip on film structure of a liquid crystal panel, wherein the tape substrate is provided with plural package units of chip on film structures arranged along its longitudinal direction, and each of the package units is provided with input leads and output leads, characterized in that:

each of the package units has a short side and a long side, and the short side and the long side are located at two opposite sides of the tape substrate, wherein the input leads are formed at the short side, while the output leads are formed at the long side, and in the adjacent package units adjacent to each other, the short side of one package unit joins the long side of a next package unit, and the input leads and the output leads of each of the package units have the same wiring density.

2. A tape substrate for chip on film structure of a liquid crystal panel, wherein the tape substrate is provided with plural package units of chip on film structures arranged along its longitudinal direction and each of the package units is provided with input leads and output leads, characterized in that: each of the package units has a short side and a long side, and the short side and the long side are located at two opposite sides of the tape substrate, wherein the input leads are formed at the short side, while the output leads are formed at the long side, and in the adjacent package units adjacent to each other, the short side of one package unit joins the long side of a next package unit, wherein each of the package units is an isosceles trapezoid, and the input leads and the output leads of each of the package units have the same wiring density.

3. A tape substrate for chip on film structure of a liquid crystal panel, wherein the tape substrate is provided with plural package units of chip on film structures arranged along its longitudinal direction, and each of the package units is provided with a driver chip, input leads and output leads, wherein the longitudinal direction of the driver chip is parallel to the longitudinal direction of the tape substrate, characterized in that:

each of the package units has a short side and a long side, and the short side and the long side are located at two opposite sides of the tape substrate, wherein the input leads are formed at the short side while the output leads are formed at the long side; in the adjacent package units adjacent to each other, the short side of one package unit joins the long side of a next package unit, and the input leads and the output leads of each of the package units have the same wiring density.

4. The tape substrate for chip on film structure of a liquid crystal panel as claimed in claim 3, characterized in that: each of the package units is an isosceles trapezoid.

5. A liquid crystal panel, the liquid crystal panel comprising a first substrate and a second substrate, wherein a transparent circuit on the second substrate is electrically connected to a driver circuit board by plural package units of chip on film structures, and each of the package units comprises a driver chip, input leads and output leads, characterized in that:

each of the package units has a short side and a long side, and the input leads are formed at the short side while the output leads are formed at the long side; the input leads are electrically connected to the driver circuit board, the output leads are electrically connected to the transparent circuit on the second substrate, and the input leads and the output leads of each of the package units have the same wiring density.

6. The liquid crystal panel as claimed in claim 5, characterized in that: each of the package units is an isosceles trapezoid.

\* \* \* \* \*